US008848470B2

(12) United States Patent
Cordero et al.

(10) Patent No.: US 8,848,470 B2
(45) Date of Patent: Sep. 30, 2014

(54) MEMORY OPERATION UPON FAILURE OF ONE OF TWO PAIRED MEMORY DEVICES

(75) Inventors: Edgar R. Cordero, Round Rock, TX (US); Timothy J. Dell, Colchester, VT (US); Girisankar Paulraj, Chennai (IN); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/597,926

(22) Filed: Aug. 29, 2012

(65) Prior Publication Data
US 2014/0063987 A1    Mar. 6, 2014

(51) Int. Cl.
*G11C 29/00* (2006.01)
(52) U.S. Cl.
CPC ............ *G11C 29/808* (2013.01); *H05K 999/99* (2013.01)
USPC ................. 365/200; 365/189.18; 365/185.09; 365/185.11
(58) Field of Classification Search
CPC .. G11C 29/808; G11C 29/785; G11C 29/846; G11C 29/848; H05K 999/99
USPC .................... 365/200, 189.18, 185.09, 185.11
See application file for complete search history.

(56) References Cited

U.S. PATENT DOCUMENTS

| 4,468,729 | A | 8/1984 | Schwartz |
| 6,493,843 | B1 | 12/2002 | Raynham |
| 6,766,429 | B1 | 7/2004 | Bland et al. |
| 6,839,266 | B1 | 1/2005 | Garrett, Jr. et al. |
| 6,937,494 | B2 | 8/2005 | Funaba et al. |
| 7,103,746 | B1 | 9/2006 | Kulick |
| 7,137,020 | B2 | 11/2006 | Gilstrap et al. |
| 7,194,577 | B2 | 3/2007 | Johnson et al. |
| 7,277,337 | B1 * | 10/2007 | Co et al. ......................... 365/200 |
| 7,370,238 | B2 | 5/2008 | Billick et al. |
| 7,447,974 | B2 | 11/2008 | Klein |
| 7,836,374 | B2 | 11/2010 | Klein |
| 7,840,860 | B2 | 11/2010 | Alves et al. |
| 7,949,850 | B2 | 5/2011 | Swanson et al. |
| 7,984,326 | B2 | 7/2011 | Bland et al. |
| 8,082,482 | B2 | 12/2011 | Gower et al. |
| 2009/0083561 | A1 | 3/2009 | Kaburlasos et al. |
| 2009/0216985 | A1 | 8/2009 | O'Connor et al. |

* cited by examiner

*Primary Examiner* — Jason Lappas
(74) *Attorney, Agent, or Firm* — Penny L. Lowry; Robert Williams (57) ABSTRACT

A method and apparatus for continued operation of a memory module, including a first and second memory device, when one of memory devices has failed. The method includes receiving a write operation request to write a data word, having first and second sections, by a first memory module. The memory module may have a first memory device and a second memory device, for respectively storing the first and second sections of the data word. A determination if one of the first and second memory devices is inoperable is made. If one of the first and second memory devices is inoperable, a write operation is performed by writing the first and second sections of the data word to the operable one of the first and second memory devices.

6 Claims, 8 Drawing Sheets

MEMORY OPERATION UPON FAILURE OF ONE OF TWO PAIRED MEMORY DEVICES

TECHNICAL FIELD

Embodiments described herein generally relate to paired memory unit operation, and more specifically, to operation during failure of single memory unit.

BACKGROUND

Modern computer systems, such as servers, use a packaged type of volatile memory in their main memories. The main memory is the place where the computer holds current programs and data that are in use. These programs in the main memory hold the instructions that the processor executes and the data that those instructions work with. The main memory is an important part of the main processing subsystem of the computer, tied in with the processor, cache, motherboard, and chipset allowing the computer system to function.

SUMMARY

In one embodiment, a method is provided for continued operation of a memory module, including a first and second memory device, if one of the memory devices has failed. The method includes receiving a write operation request to write a data word, having first and second sections, by a first memory module. The memory module, having a first memory device and a second memory device, is operated for storing the sections of the data word. A determination if one of the first and second memory devices is inoperable is made. If one of the first and second memory devices is inoperable a write operation is performed by writing the first and second sections of the data word to the operable of the first and second memory devices.

In another embodiment, an apparatus is provided for continued operation of a memory module, including a first and second memory device, if one of memory devices has failed. The apparatus includes a memory module, having a first and a second memory device. The memory devices store a first section and second section of a data word. The apparatus also includes a logic module that, upon determination that one of either the first or second memory devices is inoperable, performs a write operation by writing the first and second sections of the data word to the operable of the first and second memory devices.

DETAILED DESCRIPTION

Figure 1:
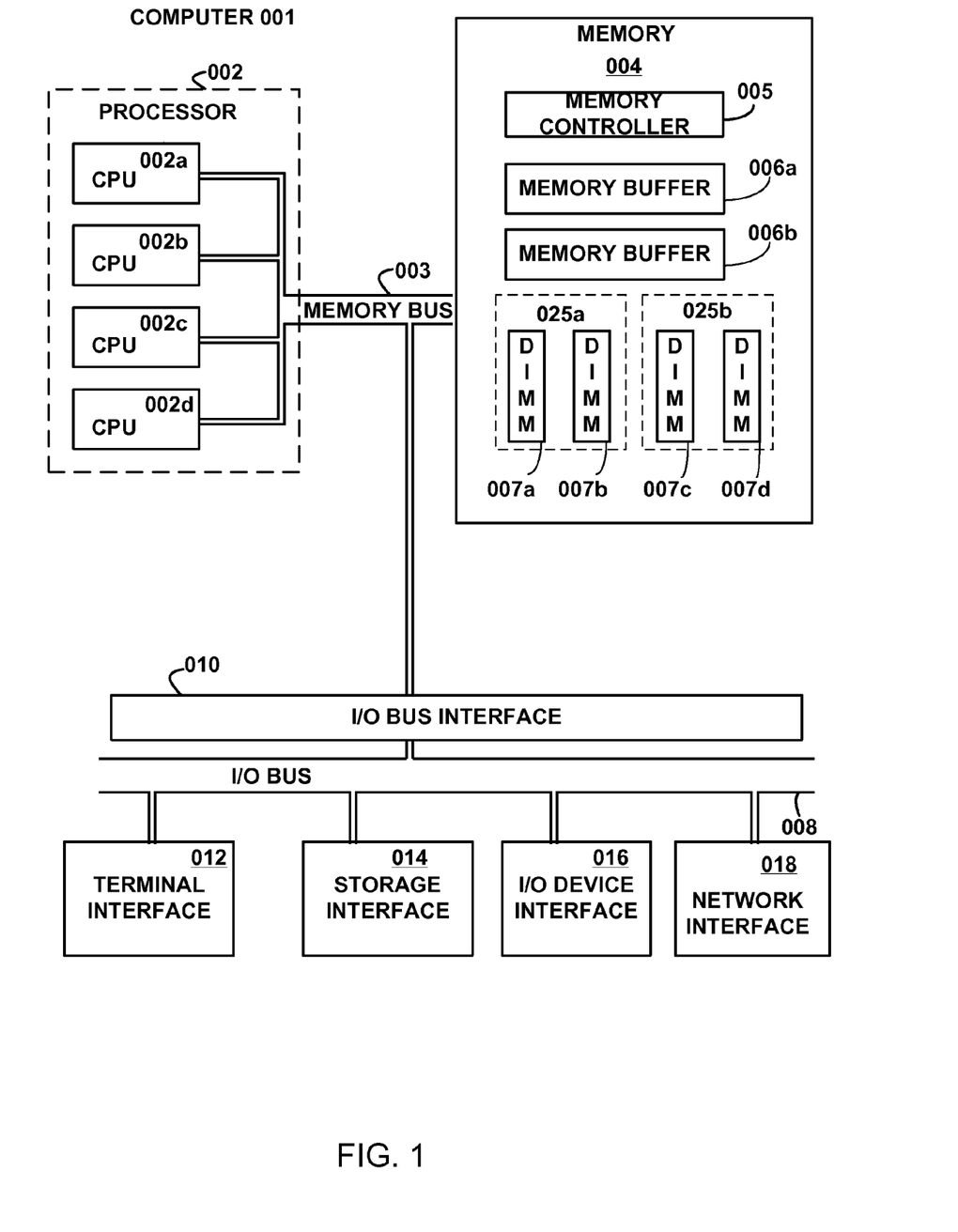
FIG. 1 depicts a high-level block diagram of an exemplary system according to an embodiment of the invention.

FIG. 1 depicts a high-level block diagram of an exemplary system for implementing an embodiment of the invention. The mechanisms and apparatus of embodiments of the present invention apply equally to any appropriate computing system. The major components of the computer system 001 comprise one or more CPUs 002, a main memory 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 contains one or more general-purpose programmable central processing units (CPUs) 002A, 002B, 002C, and 002D, herein generically referred to as the CPU 002. In an embodiment, the computer system 001 contains multiple processors typical of a relatively large system; however, in another embodiment the computer system 001 may alternatively be a single CPU system. Each CPU 002 executes instructions stored in the main memory 004 and may comprise one or more levels of on-board cache.

In an embodiment, the main memory 004 may comprise a random-access semiconductor memory, storage device, or storage medium (either volatile or non-volatile) for storing data and programs. In another embodiment, the main memory 004 represents the entire virtual memory of the computer system 001, and may also include the virtual memory of other computer systems coupled to the computer system 001 or connected via a network. The main memory 004 is conceptually a single monolithic entity, but in other embodiments the main memory 004 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory 004 may contain elements for control and flow of memory used by the CPU 002. This may include all or a portion of the following: a memory controller 005, one or more memory buffers 006A and 006B, and one or more memory devices 007A, 007B, 007C, and 007D. In the illustrated embodiment, the memory devices may be dual in-line memory modules (DIMMs), which are a series of dynamic random-access memory integrated circuits mounted on a printed circuit board and designed for use in personal computers, workstations, and servers. In various embodiments, these elements may be connected with buses for communication of data and instructions. In other embodiments, these elements may be combined into single chips that perform multiple duties or integrated into various types of memory modules. The illustrated elements are shown as being contained within the memory 004 in the computer system 001, in other embodiments some or all of them may be on different computer systems and may be accessed remotely, e.g., via a network.

Although the memory bus 003 is shown in FIG. 1 as a single bus structure providing a direct communication path among the CPUs 002, the main memory 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, or any other appropriate type of electronic device.

FIG. 1 is intended to depict the representative major components of an exemplary computer system 001. But individual components may have greater complexity than represented in FIG. 1, components other than or in addition to those shown in FIG. 1 may be present, and the number, type, and configuration of such components may vary. Several particular examples of such complexities or additional variations are disclosed herein; these are by way of example only and are not necessarily the only such variations.

In computer systems 001, the CPU 002 requires that information be communicated to and from the CPU 002 in data words which are a designated amount of bytes, and each byte may consist of 8 bits. In one embodiment, the CPU 002 requires the data word to be 128 bits in size. In another embodiment, the specific memory requirement, defined as "N", may be any amount of bits, typically a power of 2, such as 64, 128, or 256, perhaps with additional bits for error checking and correction (ECC). To allow this to occur with a minimum number of errors, information may pass through a memory controller 005. A memory controller 005 is a digital circuit which manages the flow of data going to and from the main memory. The memory controller 005 may be a separate chip or integrated into another chip, such as on the die of a microprocessor, which may be referred to as an integrated memory controller (IMC). In some embodiments, memory controllers 005 may be implemented on the system's motherboard or other remote location from the CPU 002. The memory controller 005 may use a memory buffer 006 which may be located within, or as a part of, the circuitry of the memory controller 005. The memory buffer may also be located remotely, such as on a memory device 007, on the board containing the processor, or in a remote location accessible to the memory controller 005.

In computer system 001, a memory module 025*a*, that includes 1st DIMM 007*a* and 2nd DIMM 007*b*, may be operated to store the data words required by the CPU 002. In one embodiment, the CPU 002 requires the data word to be 128 bits. A memory module 025A may provide the total of 128 bits with each DIMM, 007*a* and 007*b*, providing access to 64 bits. The DIMM 007*a* and 007*b*, in this example, are an example of a memory module used in many computer applications. DIMM memory devices are often paired in computer systems to match the maximum data bandwidth the CPU can use with standard memory interfaces, thus allowing for optimized use of the CPU's processing power without having to use a non-standard computer component. The memory buffer 006 includes logic that combines the bits from the 1st DIMM 007*a* of 64 bits and the 2nd DIMM 007*b* of 64 bits to create the 128 bit data word. This assembly and operation of memory may be used for any total N value of bits, not just 128 bits, with each memory device typically handling N/2 amount of bits.

The memory buffers, 006*a* and 006*b*, in this embodiment, may be intelligent memory buffers, each of which includes an exemplary type of logic module. Such logic modules may include hardware, firmware, or both for a variety of operations and tasks, examples of which include: data buffering, data splitting, and data routing. The logic module for memory buffer 006*a* may control the DIMMs, 007*a* and 007*b*, the data flow between them and memory buffer 006*a*, and data flow with outside elements, such as the memory controller 005 or other memory buffer 006*b*. Outside elements, such as the memory controller 005 and other memory buffer 006*b* may have their own logic modules that the logic module of memory buffer 006*a* interacts with. The logic modules may be used for error detection and correcting schemes for errors that may occur in the DIMMs. Examples of such schemes include: Error Correcting Code (ECC), Built-In-Self-Test (BIST), extended exercisers, and scrub functions. The firmware or hardware may add additional sections of data for error determination as the data is passed through the system. Logic modules throughout the system, including but not limited to the memory buffer 006*a*, memory controller 005, and even the CPU 002 may use these schemes in the same or different forms. These logic modules may communicate errors and changes to memory usage to a hypervisor. The hypervisor is a system that is used to map memory in the system 001 and tracks the location of data in memory systems used by the CPU 002. In embodiments that combine or rearrange elements, aspects of the firmware, hardware, or logic modules capabilities may be combined or redistributed. These variations would be apparent to one skilled in the art.

Figure 2A:
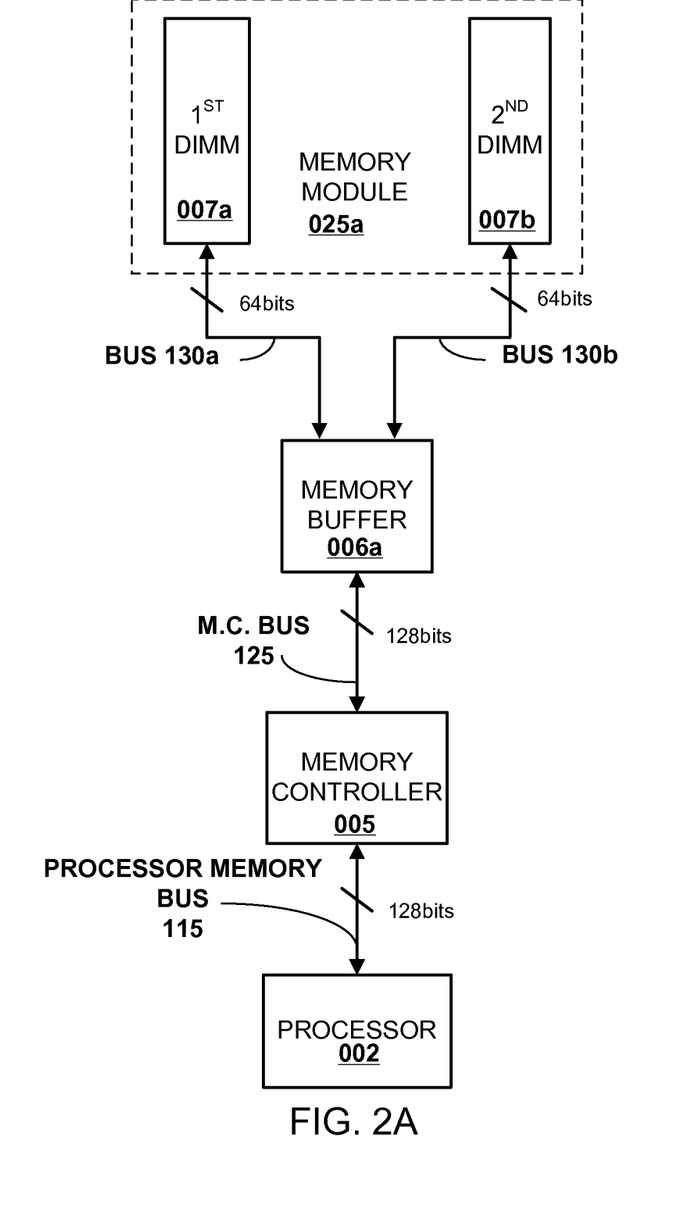
FIG. 2A is a simplified high level diagram of one embodiment of a system using dual memory units, in accordance with the present invention.
Figure 2B:
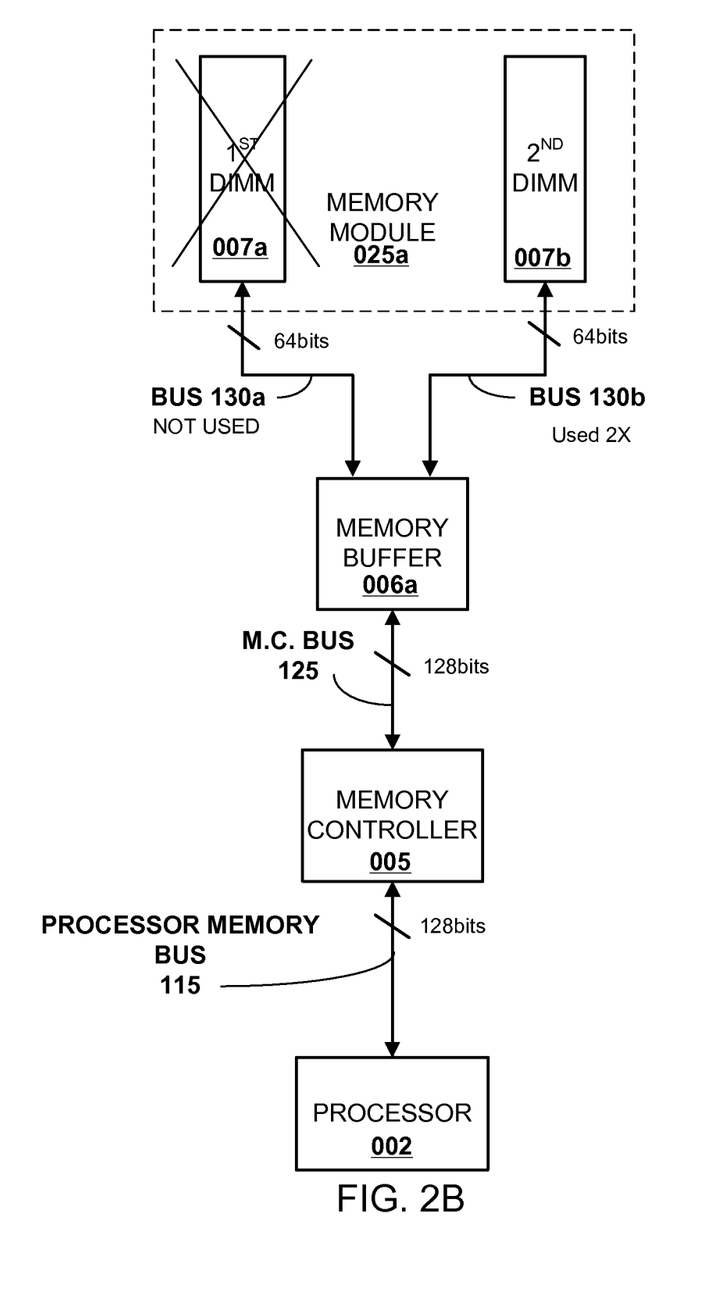
FIG. 2B is a simplified high level diagram of one embodiment of a system using dual memory units with one memory unit failed, in accordance with the present invention.

FIG. 2A and FIG. 2B are diagrams of memory usage that illustrate an embodiment of the invention. FIG. 2A is a diagram wherein a first memory device, 1st DIMM 007*a*, and a second memory device, 2nd DIMM 007*b*, have no failures. FIG. 2B is a diagram of the same system, wherein the 1st DIMM 007*a* has failed. In FIG. 2A, a processor 002 accesses, for either reading or writing a data word of 128 bits, a memory controller 005 through a memory bus 115. The bus sizes throughout the system may, in various embodiments, be different than the size unit of data required by various elements. For example the processor 002 may require units of 128 bytes while the memory bus may have a size, sometimes referred to as width, lanes, or wires, of only 128 bits, in such cases the transfer of the full 128 bytes required may occur over multiple bus transfer cycles. The memory controller 005, in response to the access request from the processor 002, accesses the data word through the memory buffer 006*a* using a memory controller bus (M.C. Bus) 125. The memory buffer 006*a*, if the access request is a write, splits the data word into a first and second section of 64 bits each so that it may be distributed between the 1st DIMM 007*a* and the 2nd DIMM 007*b*. The pairing of 1st DIMM 007*a* and 2nd DIMM 007*b* is referred to as a memory module 025. The 1st DIMM 007*a* and 2nd DIMM 007b may have the first and second sections of the data word written to them in parallel by the memory buffer 006a. If a read operation is requested, the memory buffer 006a reads the first and second sections of the data word, 64 bits from each DIMM, and stores it for access by the memory controller 005. The memory buffer 006a and the memory module 025 are in communication using buses 130a and 130b respective to each DIMM 007a and 007b.

In FIG. 2B, a failure has occurred in the 1st DIMM 007a, which traditionally results in the firmware or hardware in the memory controller 005 treating the memory module 170 and memory buffer 006a as unusable. The treatment of the memory module 170 as unusable results in inefficient operation of the memory as the still working 64 bit capability of the $2^{nd}$ DIMM 007b goes unused. In this embodiment, though, when the failure occurs in the 1st DIMM 007a, the memory controller 005 continues to operate the memory buffer 006a and the still working 2nd DIMM 007b. A logic module that is part of the memory buffer 006a allows the data word to be accessed completely through the 2nd DIMM 007b. In various embodiments, the logic module may be part of the memory buffer, the memory controller, the memory module, or a separate entity within the system. The memory controller 005 requests that data be accessed, either read or written, by the memory buffer 006a the same as it did prior to the failure of the 1st DIMM 007a. When the access request is a write operation, the memory buffer 006a may, as it did previously, split the data word provided into a first and second section. The memory buffer 006a, on instruction from the logic module, sends the first data section to be written to the 2nd DIMM 007b using bus 130b. The memory buffer 006a, on instruction from the logic module, then sends the second data section to be written to the 2nd DIMM 007b using bus 130b. This sequential writing to the working 2nd DIMM results in the complete data word being written as requested by the memory controller 005. In other embodiments, the writing of the first and second sections of the data word to the working DIMM 007a or 007b need not be sequential; rather, it may be done in parallel or with overlap in the writing process if the system is capable of it.

When the access request is a read operation, the memory buffer 006a, at the direction of the logic module, may read the first section of the data word from the 2nd DIMM 007b and then read the second section of the data word from the 2nd DIMM 007b. The sections are stored together in a data buffer so that the data word may be accessed per the read request.

In various embodiments, elements may be integrated such as the memory controller 005 and memory buffer 006a may be a single integrated unit. Such embodiments may eliminate the memory controller bus 125. The actions of the elements may also be rearranged or redistributed, such as the splitting of data into sections may occur in the memory controller 005 instead of memory buffer 006a, in various embodiments. These variations would be apparent to one skilled in the art.

Figure 3A:
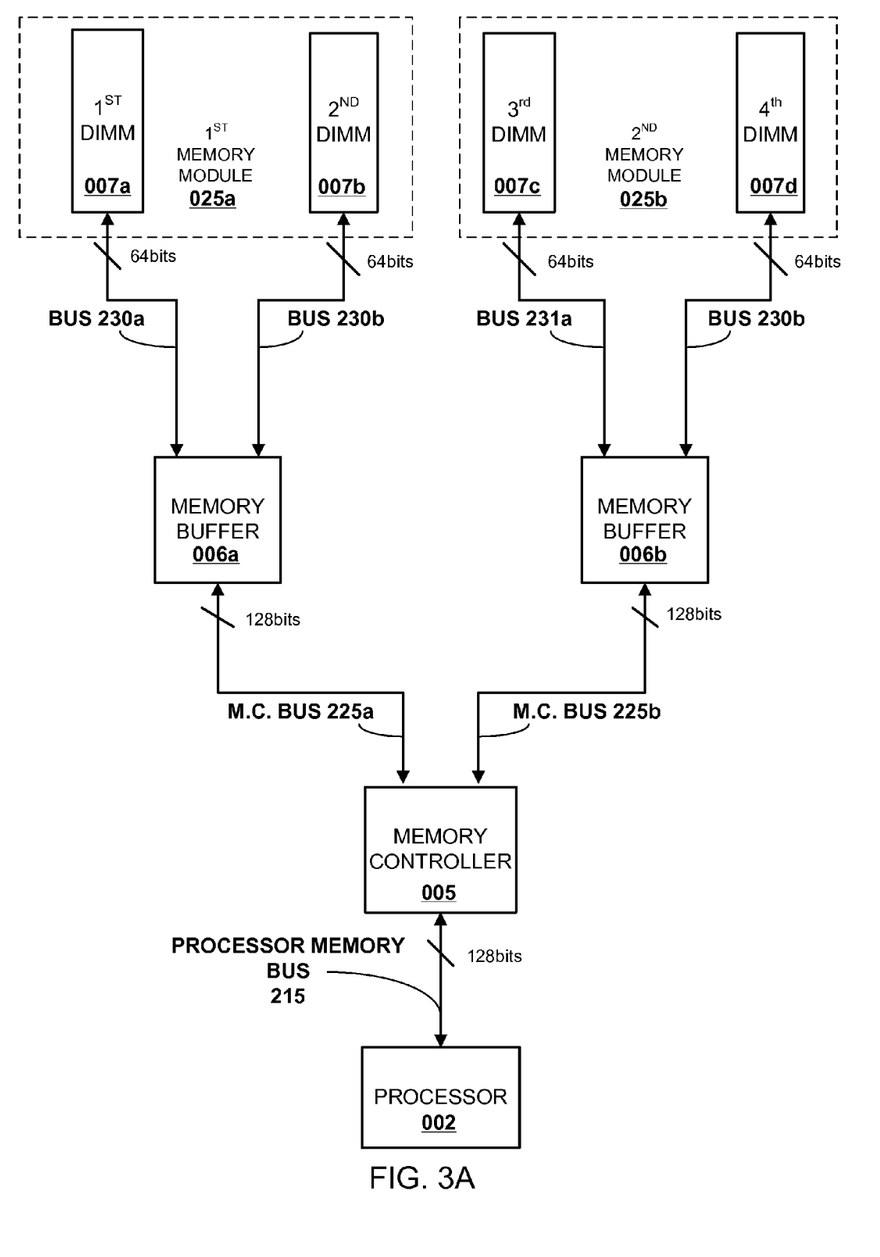
FIG. 3A is a simplified high level diagram of one embodiment of a system using multiple dual memory units, in accordance with the present invention.
Figure 3B:
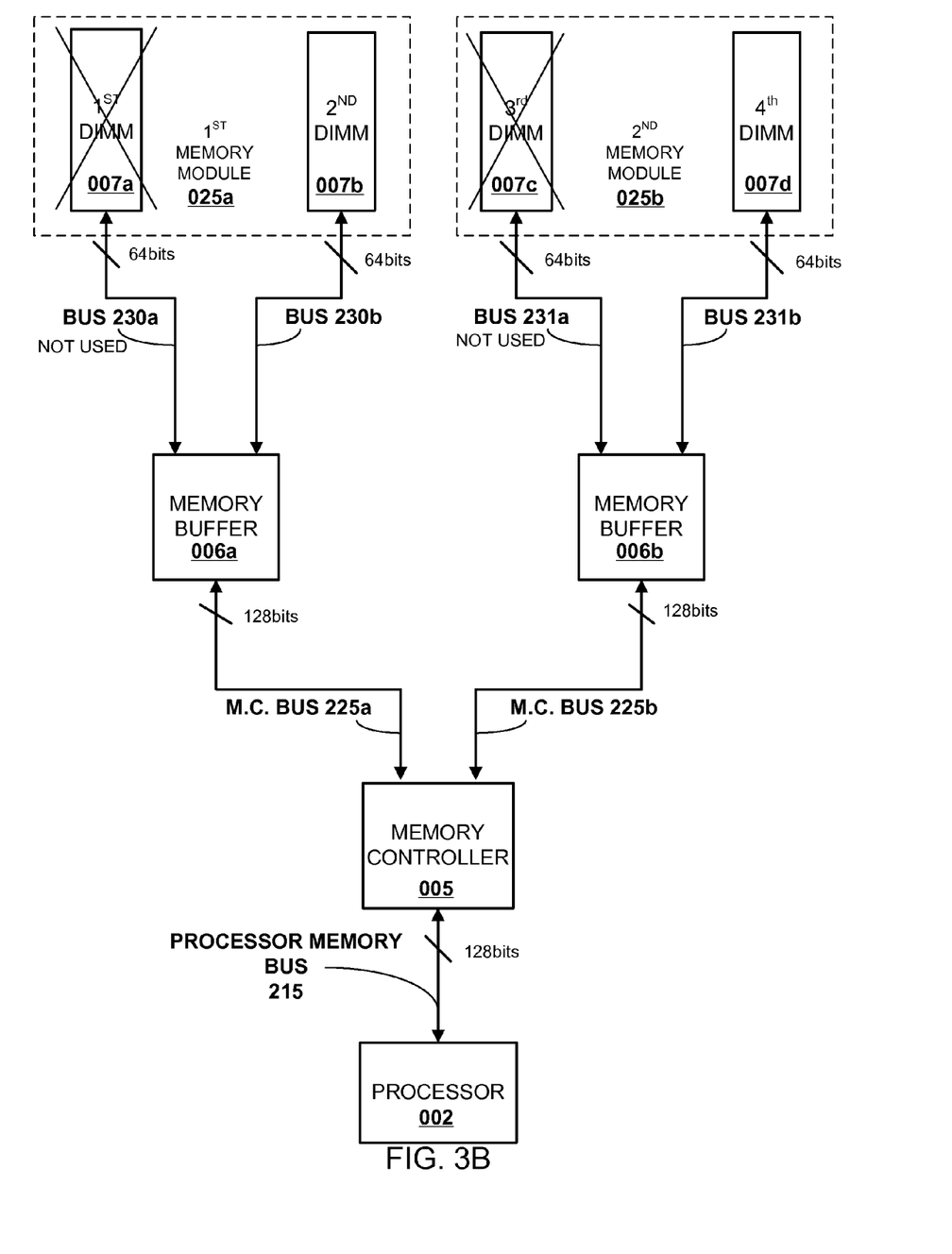
FIG. 3B is a simplified high level diagram of one embodiment of a system using multiple dual memory units with failures in multiple memory units, in accordance with the present invention.

FIG. 3A and FIG. 3B are diagrams of memory usage showing an embodiment of the invention. In FIG. 3A, no memory devices have failed, and in FIG. 3B, a first memory device, 1st DIMM 007a, and a third memory device, 3rd DIMM 007c, have failed. The pairing of a 1st DIMM 007a with a 2nd DIMM 007b and the pairing of a 3rd DIMM 007c with a 4th DIMM 007d are referred to as a memory module 025a and memory module 025b, respectively. The memory modules, 025a and 025b, each provide 128 bits to their respective memory buffers, 006a and 006b, by combining the 64 bits accessed by each DIMM 250. A processor 002 accesses a memory controller 005 for a data word. The memory controller 005, in response to the access request from the processor 002, accesses the data through either a first memory buffer 006a or a second memory buffer 006b. Whichever of the of the respective memory buffers, 006a or 006b, is used to access the data, the assigned memory buffer 006, in a write operation request, proceeds to split the data word into a first and second section each of 64 bits so that it may be distributed between the respective DIMMs 007 of its memory module 025. The memory buffer 006 may then write the first and second sections of the data word in parallel to the respective DIMMs 007.

If the access request is a read operation request, the memory buffer 006b may combine the first and second sections of the data word read from the two DIMMs 007a and 007b of its memory module 025a. The memory buffer 006a may store the first and second sections of the data word so that the data word may be accessed by the memory controller. The memory buffers, 006a and 006b, may have data workload distributed to them in any method or logic used by the memory controller.

In FIG. 3B, a failure has occurred in two DIMMs that are not part of the same memory module 025, 1st DIMM 007a and 3rd DIMM 007c. Typically, if a single DIMM 007 failed, the memory module 025 and their accompanying memory buffer 006 would be considered unusable by the memory controller 005. In the illustrated example, the failure of a single DIMM 007 in two separate memory modules 025a and 025b may each utilize the process for continued operation illustrated in FIGS. 2A and 2B or other techniques consistent with the principles of the invention. The failing of a second DIMM, the 3rd DIMM 007c on a second memory module 025b, provides for the illustrated embodiment of the invention.

In the illustrated embodiment, the memory controller 005 is aware of 1st DIMM 007a and 3rd DIMM 007c failing on the two memory modules 025a and 025b. The memory controller continues to access data through the still working 2nd DIMM 007b and 4th DIMM 007d using a first logic module that may be located within the memory controller 005. If a write operation request is sent to the memory controller the first logic module may split the data word into a first section and a second section. The first logic module may also have the first data section written to operable 2nd DIMM 007b via memory buffer 006a, and the second data section written to operable $4^{th}$ DIMM 007d via memory buffer 006b. The writing of individual word sections to DIMMs 007 of unrelated memory modules 025a and 025b may be allowed and facilitated by a second and a third logic module that may be in the respective first memory buffer 006a and second memory buffer 006b. The second and third logic modules may allow for the accessing of individual DIMMs 007 on their respective memory modules 025a and 025b.

If the access request is a read operation request, the first section of the data word is read from the 2nd DIMM by first memory buffer 006a and the second section of the data word is read from the 4th DIMM by second memory buffer 006b. The first and second sections of the data word may then be accessed by the memory controller 005. The memory controller 005 may then store the first and second sections of the data word within a data buffer, within the memory controller 005 or remotely, to form the complete data word for access by the processor 002.

In various embodiments, the logic module, or modules that allow for the access may be part of the memory buffers 240, memory controller 005, the memory modules 270, or a separate entity within the system. The logic module may also reconfigure the memory usage, per various embodiments of this invention, as failures occur, moving between variations and protecting existing data as use changes. In various embodiments, elements may be integrated such as the memory controller 005, and memory buffers 006a and 006b may be a single integrated unit. Such embodiments may eliminate the memory controller buses 225a and 225b. The actions of the elements may also be rearranged or redistributed, such as the splitting of data into sections may occur in the memory buffers 006a and 006b, in various embodiments. These variations would be apparent to one skilled in the art.

Figure 4A:
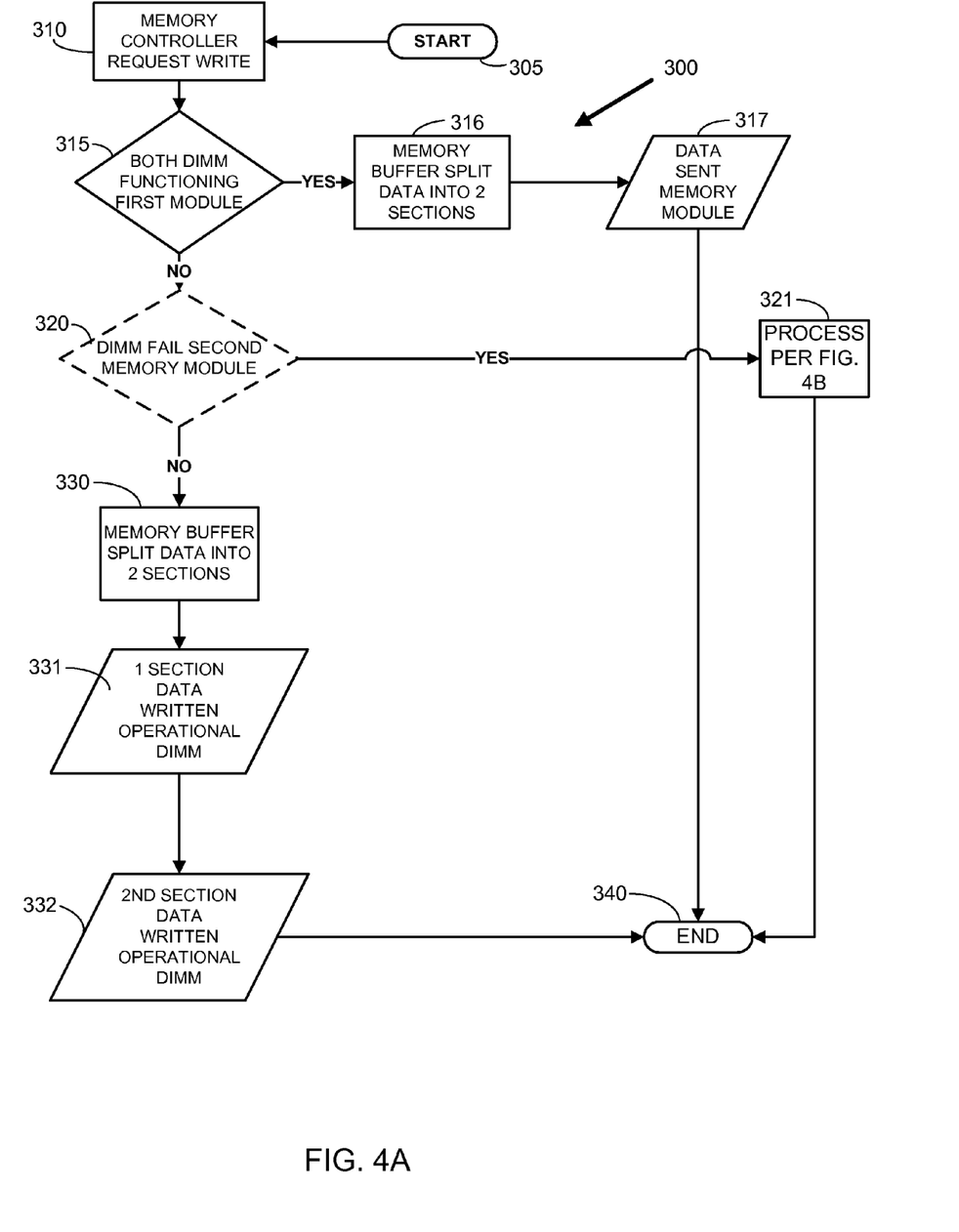
FIG. 4A is a flowchart of a method for continued operation of dual memory units upon a failure in one or more memory units, in accordance with the present invention.
Figure 4B:
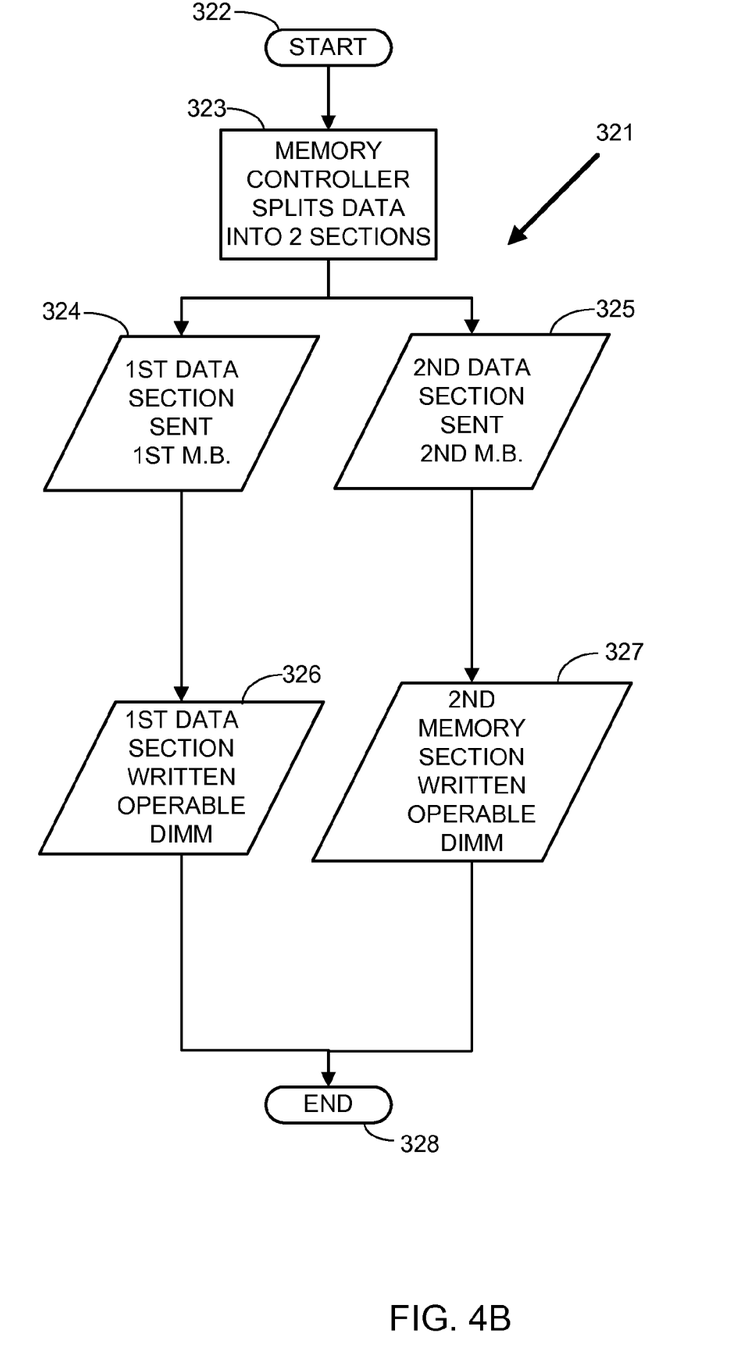
FIG. 4B is a detailed flowchart of a process of FIG. 4A, in accordance with the present invention.
Figure 4C:
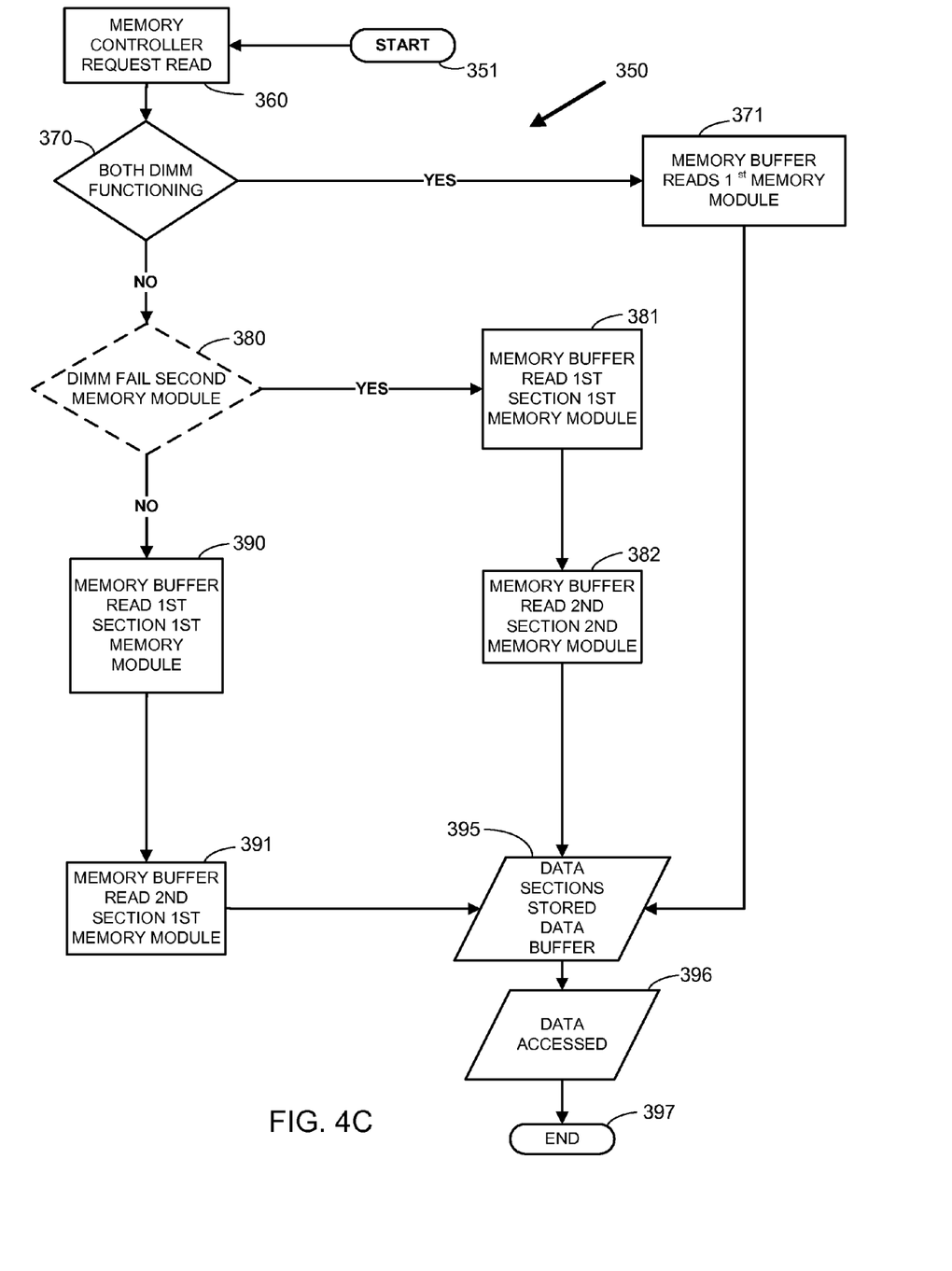
FIG. 4C is a flowchart of a method for continued operation of dual memory units upon a failure in one or more memory units, in accordance with the present invention.

FIGS. 4A, 4B, and 4C are flowcharts of a method 300 and 350 to allow the system presented in FIGS. 3A and 3B to continue using operational memory devices when a single DIMM 250 failure occurs in one or both memory modules, 025a or 025b. The methods outlined in FIGS. 4A, 4B, and 4C show how the multiple embodiments of the invention may used to handle a variety of requests in various failure situations. FIGS. 4A and 4B review methods of handling write requests to the memory modules per an embodiment of the invention, and FIG. 4C reviews methods of handling read requests to the memory modules.

In FIG. 4A, the method 300 begins at block 305. At block 310, the memory controller 005 may request to write a data word to the first memory module 025a through first memory buffer 006a. At block 315, a check may be made to see if both of a first and second memory device, e.g., the $1^{st}$ DIMM 007a and $2^{nd}$ DIMM 007b of memory module 025a are functioning. If both DIMMS of the memory module 025a are functioning, the first memory buffer 006a splits the data word into a first and second data section in block 316. The data sections may then be written to the $1^{st}$ DIMM and $2^{nd}$ DIMM in block 317, each DIMM receiving only one of the two data sections created by the first memory buffer 006a in block 316. The write action to the DIMMs 007a and 007b in block 317 may be made in parallel, thus reducing the cycle time required for the step. The process then ends at block 340.

If the check made at block 315, to see if both the $1^{st}$ DIMM 007a and $2^{nd}$ DIMM 007b of the memory module 025a are functioning results in a negative answer, the method may proceed to an optional, second check at block 320 depending on the existence of the second memory module 025b. The optional check at block 320 determines whether a third or fourth memory device, e.g., $3^{rd}$ DIMM 007c or $4^{th}$ DIMM 007d, in a second memory module 025b has failed. In various embodiments, this operation may be performed by firmware, hardware, logic modules, or buses that are part of the memory system connected to the two memory modules, 025a and 025b, or a combination thereof. If the answer is "no" in block 320, then the method proceeds to block 330 where the first memory buffer 006a may split the data word into a first and second data section. In block 331, the first data section is written to the still operational DIMM, 007a or 007b, of memory module 025a. The first memory buffer 006a may then write the second data section to the same still operational DIMM, 007a or 007b, of memory module 025a in block 332. This sequential writing of the data to the operational DIMM, 007a or 007b, by the first memory buffer 006a may be accomplished by a logic module. In other embodiments, the writing of the first and second sections of the data word to the working DIMM 007a or 007b need not be sequential; rather, it may be done in parallel or with overlap in the writing process if the system is capable of it. The logic module may, in various embodiments, be found contained within the first memory buffers 006a, memory controller 005, the memory modules 025a, or a separate entity within the system. The process then ends at block 340.

If the check at block 320 determines that a DIMM, either 007c or 007d, has failed in memory module 025b, the method proceeds to the process of block 321. This process is shown in detail in FIG. 4B starting at block 322. At block 323, the memory controller 005 proceeds to split the data word into a first and second data section. The memory controller 005 may send the first data section to the first memory buffer 006a in block 324. The first memory buffer 006a may write the first data section to the still operational DIMM, either 007a or 007b, of first memory module 025a in block 326. The memory controller 005 may send the second data section to the second memory buffer 006b in block 325. The second memory buffer 006a may write the second data section to the still operational DIMM, either 007c or 007d, of second memory module 025b in block 327. The detailed process 321 ends at block 327 and the process 300 of in FIG. 4A ends at block 340. In other embodiments the data word may be sent to both the first and second memory buffers 006a and 006b and split for writing to the operation DIMMs 007 there.

FIG. 4C provides a flowchart for the reading of the stored data word from the DIMMs 007 once it has been written by the method of FIGS. 4A and 4B. The method 350 starts at block 351 and at block 360 the memory controller 005 requests to read the data word previously stored. In block 370, it is determined if DIMMs 007a and 007b of memory module 025a are functioning. If the answer is "yes", the method progresses to block 371 where the memory buffer reads the two data sections from the first memory module 025a, the first data section from $1^{st}$ DIMM 007a and the second data section from $2^{nd}$ DIMM 007b. In block 395, the data sections may be stored in a data buffer so that the data word may be accessed in block 396, and the method ends at block 397.

The method may progresses to block 380 if a second memory module 025b exists in the system and it is determined in block 370 that one of the DIMMs 007a and 007b of first memory module 025a is not operational. In optional block 380, it may be determined if either DIMM 007c or 007d in second memory module 025b has failed. If a positive response is determined in block 380, the method progresses to block 381 where the first data section is read from the operational DIMM 007a or 007b of the first memory module 025a. In block 382, the second data section is read from the operational DIMM, 007c or 007d, of the second memory module 025b. In block 395, the data sections may be stored in a data buffer so that the data word may be accessed in block 396, and the method ends at block 397.

The method progresses to block 390 if both DIMMs 007c and 007d are operable in second memory module 025b, or if a second memory module 025b is not in the system. In block 390, the first memory buffer 006a reads the first data section from the operational DIMM, either 007a or 007b, of memory module 025a. The first memory buffer 006a then proceeds to read the second data section from the same operational DIMM, either 007a or 007b, of memory module 025a in block 391. In block 395, the data sections may be stored in a data buffer so that the data word may be accessed in block 396, and the method ends at block 397.

In various embodiments, elements may be integrated such as the memory controller 005 and memory buffers 006a and 006b may be a single integrated unit. This variation in elements may result in rearranging or redistributing where various steps of the method may be performed. In other embodiments, tasks may be redistributed between elements. An example of this is the splitting of data into sections; this may occur in the memory controller 005 or in the memory buffers 006a and 006b in various embodiments. These variations would be apparent to one skilled in the art.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A method comprising:
receiving a request to write a data word to a first memory module, the data word having first and second sections, the first memory module having a first memory device to store the first section of the data word and a second memory device to store the second section of the data word;
determining whether one of the first and second memory devices is inoperable;
determining whether one memory device of a second memory module, having third and forth memory devices, is inoperable; and
performing the requested write operation if one of the first and second memory devices is inoperable and one of the third and fourth memory devices is inoperable by writing the first section of the data word to the operable memory device of the first memory module and the second section of the data word to the operable memory device of the second memory module.

2. The method of claim 1, further comprising:
receiving a request to read the data word from the first memory module;
reading the first section of the data word from the operable memory device of the first memory module;
reading the second section of the data word from the operable memory device of the second memory module; and
storing the first and second sections in a data buffer to form the requested data word to be read.

3. A memory system apparatus, comprising:
a first memory module having a first memory device to store a first section of a data word and a second memory device to store a second section of the data word;
a second memory module having a third and a fourth memory device; and
a first logic module, upon determination that one of either the first or second memory devices is inoperable and one of either the third or fourth memory devices is inoperable, to perform a write operation by writing the first section of the data word to the operable memory device of the first memory module and the second section of the data word to the operable memory device of the second memory module.

4. The apparatus of claim 3, further comprising a second logic module in communication with the first and second memory devices, the second logic module configured to enable the first logic module to access the first and second memory devices individually.

5. The apparatus of claim 3, further comprising a third logic module in communication with the third and fourth memory devices, the third logic module configured to enable the first logic module to access the third and fourth memory devices individually.

6. The apparatus of claim 3, further comprising a data buffer to store the first and second sections of the data word upon the memory system receiving a read request for the word wherein the first section of the data word is read from the operable one of the first and second memory devices and the second data section is read from the operable one of the third and fourth memory devices if one of either the first or second memory devices is inoperable and one of either the third or fourth memory devices is inoperable.

* * * * *